(12) United States Patent
Dory et al.

(10) Patent No.: US 10,787,628 B2
(45) Date of Patent: Sep. 29, 2020

(54) CLEANING COMPOSITIONS

(71) Applicant: Fujifilm Electronic Materials U.S.A., Inc., N. Kingstown, RI (US)

(72) Inventors: Thomas Dory, Gilbert, AZ (US); Emil A. Kneer, Mesa, AZ (US); Tetsuya Kamimura, Shizuoka (JP)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 158 days.

(21) Appl. No.: 16/106,331

(22) Filed: Aug. 21, 2018

(65) Prior Publication Data

US 2019/0062674 A1 Feb. 28, 2019

Related U.S. Application Data

(60) Provisional application No. 62/548,474, filed on Aug. 22, 2017, provisional application No. 62/553,281, filed on Sep. 1, 2017.

(51) Int. Cl.

| C11D 7/50 | (2006.01) |
|---|---|
| C11D 3/28 | (2006.01) |
| C11D 3/04 | (2006.01) |
| C11D 11/00 | (2006.01) |
| C11D 3/43 | (2006.01) |
| C11D 7/28 | (2006.01) |
| C11D 7/10 | (2006.01) |
| C11D 7/08 | (2006.01) |
| C11D 7/32 | (2006.01) |
| C11D 3/20 | (2006.01) |

(52) U.S. Cl.
CPC ............... *C11D 3/28* (2013.01); *C11D 3/042* (2013.01); *C11D 3/046* (2013.01); *C11D 3/43* (2013.01); *C11D 7/08* (2013.01); *C11D 7/10* (2013.01); *C11D 7/28* (2013.01); *C11D 7/3281* (2013.01); *C11D 7/5004* (2013.01); *C11D 11/0047* (2013.01); *C11D 3/2041* (2013.01); *C11D 3/2068* (2013.01); *C11D 7/5022* (2013.01)

(58) Field of Classification Search
CPC .................................................. C11D 11/0047
USPC ........................................................ 510/175
See application file for complete search history.

(56) References Cited

U.S. PATENT DOCUMENTS

| 2010/0248486 | A1 | 9/2010 | Nakamura |
| 2013/0330927 | A1 | 12/2013 | Kumagai et al. |
| 2014/0087313 | A1 | 3/2014 | Ueno et al. |
| 2015/0279654 | A1 | 10/2015 | Kato et al. |
| 2015/0307818 | A1* | 10/2015 | Barnes ............ H01L 21/02063 510/175 |
| 2016/0186106 | A1* | 6/2016 | Du .................... G03F 7/425 510/176 |
| 2017/0200601 | A1* | 7/2017 | Song ............... H01L 21/02063 |
| 2017/0200619 | A1* | 7/2017 | Cooper ................... C11D 7/28 |

FOREIGN PATENT DOCUMENTS

| CN | 105297022 | 2/2016 |
| JP | 2016-25321 | 2/2016 |
| WO | WO 2008-080097 | 7/2008 |
| WO | WO 2016/084860 | 6/2016 |
| WO | WO 2017/011617 | 1/2017 |
| WO | WO 2017/038664 | 3/2017 |

OTHER PUBLICATIONS

The International Search Report and Written Opinion of the International Searching Authority for International Application No. PCT/US2018/047155 dated Dec. 4, 2018.
The International Preliminary Report on Patentability for International Application No. PCT/US2018/047155 dated Mar. 5, 2020.

* cited by examiner

*Primary Examiner* — Gregory E Webb
(74) *Attorney, Agent, or Firm* — Fish & Richardson P.C.

(57) ABSTRACT

The present disclosure is directed to non-corrosive cleaning compositions that are useful, e.g., for removing residues (e.g., plasma etch and/or plasma ashing residues) and/or metal oxides from a semiconductor substrate as an intermediate step in a multistep manufacturing process.

90 Claims, No Drawings

CLEANING COMPOSITIONS

CROSS-REFERENCE TO RELATED APPLICATIONS

The present application claims priority to U.S. Provisional Application Ser. No. 62/553,281, filed on Sep. 1, 2017, and U.S. Provisional Application Ser. No. 62/548,474, filed on Aug. 22, 2017, the contents of which are hereby incorporated by reference in their entirety.

FIELD OF THE DISCLOSURE

The present disclosure relates generally to compositions and processes to remove residues from semiconductor substrates during manufacturing of semiconductor devices. In particular, the compositions of the disclosure are useful for selectively removing etch residues and/or metal oxides from substrates in the presence of other materials, such as metal conductors, barrier materials, insulator materials, and exposed or underlying layers of copper, tungsten, and low-k dielectric materials.

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

Metal containing layers (or metal containing films) in a semiconductor substrate (e.g., those used for integrated circuits) are generally susceptible to corrosion. For example, metals or metal alloys such as aluminum, copper, aluminum-copper alloy, tungsten nitride, tungsten (W), cobalt (Co), titanium oxide, and other metals, metal oxides, and metal nitrides, will readily corrode and dielectrics [ILD, ULK] can etch by using conventional cleaning chemistries. In addition, the amount of corrosion tolerated by the integrated circuit device manufacturers is getting smaller and smaller as the device geometries shrink.

At the same time, as residues become harder to remove and corrosion must be controlled to ever lower levels, cleaning solutions must be safe to use and environmentally friendly.

Therefore, the cleaning solution should be effective for removing the plasma etch and plasma ash residues and must also be non-corrosive to all exposed substrate materials (e.g., metals, metal oxides, or metal nitrides).

SUMMARY OF THE DISCLOSURE

The present disclosure is directed to non-corrosive cleaning compositions that are useful for selectively removing etch residues (e.g., plasma etch and/or plasma ashing residues) and/or certain metal oxides from a semiconductor substrate as an intermediate step in a multistep manufacturing process. These residues include a range of relatively insoluble mixtures of organic compounds such as residual photoresist, organometallic compounds, metal oxides which are formed as reaction by-products from exposed metals or metal alloys such as aluminum, aluminum/copper alloy, copper, titanium, tantalum, tungsten, cobalt, metal nitrides such as titanium and tungsten nitrides, and other materials. The cleaning compositions described herein can selectively remove a broad range of residues encountered on semiconductor substrates and are generally non-corrosive to exposed substrate materials (e.g., exposed metals or metal alloys such as aluminum, aluminum/copper alloy, copper, titanium, tantalum, tungsten, and cobalt, and metal nitrides such as titanium and tungsten nitrides).

In one embodiment, the disclosure features cleaning compositions that include: a) at least one fluoride containing compound; b) at least one tetrazole; c) at least one triazine; d) at least one organic solvent; and e) water.

In another embodiment, the disclosure features cleaning compositions that include: a) at least one fluoride containing compound; b) at least one tetrazole; c) at least one organic solvent; and d) water, in which the composition does not include a sulfobenzoic anhydride.

In another embodiment, the disclosure features cleaning compositions that include: a) at least one fluoride containing compound; b) at least one tetrazole selected from the group consisting of 1H-tetrazole and 1H-tetrazole-5-carboxylic acid; c) at least one organic solvent; and d) water.

In another embodiment, the disclosure features cleaning compositions that include: a) at least one fluoride containing compound, provided that the at least one fluoride containing compound does not include HF; b) at least one tetrazole; c) at least one organic solvent; and d) water.

In another embodiment, the disclosure features cleaning compositions that include: a) at least one fluoride containing compound; b) at least one first azole compound, in which the first azole compound is a diazole; c) at least one second azole compound, in which the second azole compound is selected from the group consisting of diazoles, triazoles, and tetrazoles; d) at least one organic solvent; and e) water.

In another embodiment, the disclosure features cleaning compositions that include: a) at least one fluoride containing compound; b) at least one azole compound selected from the group consisting of diazoles, triazoles and tetrazoles; c) at least one organic solvent in an amount of at least about 90 wt % of the composition; and d) water.

In another embodiment, the disclosure features methods for cleaning semiconductor substrates. Such methods can be performed, for example, by contacting a semiconductor substrate containing post etch residues and/or post ash residues with a cleaning composition of the present disclosure.

In still another embodiment, the disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.).

In some embodiments, the disclosure features cleaning compositions including (e.g., consisting of or consisting essentially of: a) at least one fluoride containing compound (such as those selected from the group consisting of HF, $H_2SiF_6$, $H_2PF_6$, $HBF_4$, $NH_4F$, and tetraalkylammonium fluoride); b) at least one tetrazole; c) at least one triazine; d) at least one organic solvent; and e) water.

In some embodiments, the fluoride containing compound in the cleaning compositions described herein can be a fluoride containing acid, e.g., HF, $H_2SiF_6$, $H_2PF_6$, or $HBF_4$. In some embodiments, the fluoride containing compound can be a fluoride containing salt, such as $NH_4F$ and tetraalkylammonium fluoride. For example, tetraalkylammonium fluoride can include $C_1$-$C_6$ alkyl groups (e.g., methyl, ethyl, propyl, isopropyl, butyl, or hexyl). Examples of suitable tetraalkylammonium fluorides can include tetramethylammonium fluoride, tetraethylammonium fluoride, tetrapropylammonium fluoride, tetraisopropylammonium fluoride, and tetrabutylammonium fluoride. In some embodiments, the fluoride containing compound is HF. In some embodiments, HF is excluded from the at least one fluoride containing compound in the cleaning compositions described herein. In some embodiments, the cleaning compositions described herein can include at least two (e.g., three, four, or five) fluoride containing compounds.

In some embodiments, the at least one fluoride containing compound is in an amount of from about 0.05 wt % to about 1.5 wt % of the cleaning compositions described herein. For example, the cleaning compositions can include at least about 0.05% by weight (e.g., at least about 0.1% by weight, at least about 0.2% by weight, at least about 0.3% by weight, or at least about 0.5% by weight) and/or at most about 1.5% by weight (e.g., at most about 1.2% by weight, at most about 1.0% by weight, at most about 0.8% by weight, at most about 0.6% by weight, or at most about 0.5% by weight) the at least one fluoride containing compound. Without wishing to be bound by theory, it is believed that the fluoride containing compound can effectively remove etch residues (e.g., plasma etch and/or plasma ashing residues) on a semiconductor substrate during a cleaning process.

In some embodiments, the tetrazole in the cleaning compositions described herein can be a substituted or unsubstituted tetrazole. For example, the tetrazole can be optionally substituted by at least one substituent selected from the group consisting of $COOR_1$ and $N(R_1R_2)$, in which each of $R_1$ and $R_2$, independently, is H or $C_1$-$C_6$ alkyl (e.g., methyl or ethyl). Examples of suitable tetrazoles include 1H-tetrazole, 1H-tetrazole-5-carboxylic acid, 5-phenyltetrazole, and 5-amio-1H-tetrazole. In some embodiments, the cleaning compositions described herein does not include 5-amio-1H-tetrazole. In some embodiments, the cleaning composition described herein can include at least two (e.g., three, four, or five) tetrazoles.

In some embodiments, the at least one tetrazole is in an amount of from about 0.01 wt % to about 1.5 wt % (e.g., from about 0.01 wt % to about 0.45 wt %) of the cleaning compositions described herein. For example, the cleaning compositions can include at least about 0.01% by weight (e.g., at least about 0.05% by weight, at least about 0.1% by weight, at least about 0.2% by weight, at least about 0.3% by weight, or at least about 0.5% by weight) and/or at most about 1.5% by weight (e.g., at most about 1.2% by weight, at most about 1.0% by weight, at most about 0.8% by weight, at most about 0.6% by weight, at most about 0.5% by weight, at most about 0.45% by weight, at most about 0.4% by weight, at most about 0.3% by weight, at most about 0.2% by weight, or at most about 0.1% by weight) the at least one tetrazole. Without wishing to be bound by theory, it is believed that the tetrazole can significantly inhibit or reduce the removal of certain metal containing materials (e.g., Co or $Al_2O_3$) on a semiconductor substrate that are exposed to the cleaning composition during a cleaning process.

In some embodiments, the triazine in the cleaning compositions described herein can be a substituted or unsubstituted triazine (e.g., 1,2,3-triazine, 1,2,4-triazine, or 1,3,5-triazine). For example, the triazine can be optionally substituted by at least one substituent selected from the group consisting of aryl and $N(R_3R_4)$, in which each of $R_3$ and $R_4$, independently, is H or $C_1$-$C_6$ alkyl (e.g., methyl or ethyl). An example of a suitable triazine is benzoguanamine (i.e., 6-phenyl-1,3,5-triazine-2,4-diamine). In some embodiments, the cleaning compositions described herein can include at least two (e.g., three, four, or five) triazines.

In some embodiments, the at least one triazine is in an amount of from about 0.01 wt % to about 0.1 wt % of the cleaning compositions described herein. For example, the cleaning compositions can include at least about 0.01% by weight (e.g., at least about 0.02% by weight, at least about 0.03% by weight, at least about 0.04% by weight, at least about 0.05% by weight, or at least about 0.08% by weight) and/or at most about 0.1% by weight (e.g., at most about 0.09% by weight, at most about 0.08% by weight, at most about 0.07% by weight, at most about 0.06% by weight, at most about 0.05% by weight, at most about 0.04% by weight, at most about 0.03% by weight, or at most about 0.02% by weight) the at least one triazine. Without wishing to be bound by theory, it is believed that the triazine can significantly inhibit or reduce the removal of a dielectric layer (such as an inter-layer dielectric (ILD) layer) on a semiconductor substrate that is exposed to the cleaning composition during a cleaning process.

In general, the cleaning compositions described herein contain at least one organic solvent (e.g., water soluble organic solvents). As defined herein, a "water-soluble" substance (e.g., a water-soluble alcohol, ketone, ester, ether, and the like) refers to a substance having a solubility of at least 5% by weight in water at 25° C. In some embodiments, the organic solvent is selected from the group consisting of alcohols, ketones, esters, and ethers (e.g., glycol ethers or glycol diethers). In some embodiments, the cleaning compositions can contain at least two (e.g., three, four, or five) organic solvents.

Classes of alcohols include, but are not limited to, alkane diols (including, but not limited to, alkylene glycols), glycols, alkoxyalcohols (including, but not limited to, glycol monoethers), saturated aliphatic monohydric alcohols, unsaturated non-aromatic monohydric alcohols, and alcohols (e.g., low molecular weight alcohols) containing a ring structure.

Examples of alkane diols include, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycols.

Examples of alkylene glycols include, but are not limited to, ethylene glycol, propylene glycol, diethylene glycol, dipropylene glycol, triethylene glycol, and tetraethyleneglycol.

Examples of alkoxyalcohols include, but are not limited to, 3-methoxy-3-methyl-1-butanol, 3-methoxy-1-butanol, 1-methoxy-2-butanol, and glycol monoethers.

Examples of glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of saturated aliphatic monohydric alcohols include, but are not limited to, methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of unsaturated non-aromatic monohydric alcohols include, but are not limited to, allyl alcohol, propargyl alcohol, 2-butenyl alcohol, 3-butenyl alcohol, and 4-penten-2-ol.

Examples of alcohols containing a ring structure include, but are not limited to, tetrahydrofurfuryl alcohol, furfuryl alcohol, and 1,3-cyclopentanediol.

Examples of ketones include, but are not limited to, acetone, propanone, cyclobutanone, cyclopentanone, cyclohexanone, diacetone alcohol, 2-butanone, 5-hexanedione, 1,4-cyclohexanedione, 3-hydroxyacetophenone, 1,3-cyclohexanedione, and cyclohexanone.

Examples of esters include, but are not limited to, ethyl acetate, glycol monoesters (such as ethylene glycol monoacetate and diethylene glycol monoacetate), and glycol monoether monoesters (such as propylene glycol monomethyl ether acetate, ethylene glycol monomethyl ether acetate, propylene glycol monoethyl ether acetate, and ethylene glycol monoethyl ether acetate).

In certain embodiments, the clean compositions described herein include at least about 90 wt % (e.g., at least about 95 wt % or at least about 97 wt %) total organic solvent.

In general, the cleaning compositions of the present disclosure can include water. In certain embodiments, the water is de-ionized and ultra-pure, contains no organic contaminants and has a minimum resistivity of about 4 to about 17 mega Ohms. In some embodiments, the resistivity of the water is at least about 17 mega Ohms. In some embodiments, the cleaning compositions of this disclosure include from about 0.1 wt % to about 2 wt % (e.g., from about 0.5 wt % to about 2 wt %) water.

In some embodiments, the cleaning compositions described herein can optionally include at least one triazole (e.g., a substituted or unsubstituted triazole). In some embodiments, the triazole can be optionally substituted by at least one substituent selected from the group consisting of alkyl groups, aryl groups (e.g., phenyl), halogen groups (e.g., F, Cl, Br, or I), amino groups, nitro groups, alkoxy groups, and hydroxyl groups. Examples of suitable triazoles include 1,2,3-triazole, 1,2,4-triazole, 3-amino-1,2,4-triazole, 3-amino-5-mercapto-1,2,4-triazole, and 3,5-diamino-1,2,4-triazole. In some embodiments, the cleaning compositions described herein can include at least two (e.g., three, four, or five) triazoles.

In some embodiments, the triazole can be a substituted or unsubstituted benzotriazole. For example, the benzotriazole can be optionally substituted by at least one substituent selected from the group consisting of alkyl groups, aryl groups (e.g., phenyl), halogen groups (e.g., F, Cl, Br, or I), amino groups, nitro groups, alkoxy groups, and hydroxyl groups. Substituted benzotriazoles also include those fused with one or more aryl (e.g., phenyl) or heteroaryl groups.

Examples of suitable benzotriazoles can include benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-dimethylpropyl)-benzotriazole, 5-(1',1',3'-trimethylbutyl) benzotriazole, 5-n-octyl benzotriazole, or 5-(1',1',3',3'-tetramethylbutyl)benzotriazole.

In some embodiments, the at least one triazole is in an amount of from about 0.05 wt % to about 1 wt % (e.g., from about 0.1 wt % to about 0.5 wt %) of the cleaning composition described herein. For example, the cleaning composition can include at least about 0.05% by weight (e.g., at least about 0.1% by weight, at least about 0.2% by weight, at least about 0.3% by weight, or at least about 0.5% by weight) and/or at most about 1% by weight (e.g., at most about 0.9% by weight, at most about 0.8% by weight, at most about 0.7% by weight, at most about 0.6% by weight, at most about 0.5% by weight, at most about 0.4% by weight, at most about 0.3% by weight, at most about 0.2% by weight, or at most about 0.1% by weight) the at least one triazole.

Without wishing to be bound by theory, it is believed that the triazole can serve as a corrosion inhibitor and can help inhibit or reduce the removal of certain metal containing materials (e.g., $Al_2O_3$ or Co) on a semiconductor substrate that are exposed to the cleaning composition during a cleaning process.

In some embodiments, the cleaning compositions described herein can optionally include at least one diazole (e.g., a substituted or unsubstituted diazole). For example, the diazole can be an imidazole or a pyrazole. In some embodiments, the diazole can be optionally substituted by at least one substituent selected from the group consisting of alkyl groups, aryl groups (e.g., phenyl), halogen groups (e.g., F, Cl, Br, or I), amino groups, nitro groups, alkoxy groups, and hydroxyl groups. Examples of suitable diazoles include 1-methylimidazole, 2-phenylimidazole, 2-methylbenzoimidazole, 2-ethyl-4-methylimidazole, pyrazole, 3,5-dimethylpyrazole, and 3-aminopyrazole. In some embodiments, the cleaning compositions described herein can include at least two (e.g., three, four, or five) diazoles.

In some embodiments, the at least one diazole is in an amount of from about 0.1 wt % to about 2 wt % (e.g., from about 0.5 wt % to about 1 wt %) of the cleaning compositions described herein. For example, the cleaning compositions can include at least about 0.1% by weight (e.g., at least about 0.2% by weight, at least about 0.3% by weight, or at least about 0.5% by weight) and/or at most about 2% by weight (e.g., at most about 1.8% by weight, at most about 1.5% by weight, at most about 1.3% by weight, at most about 1% by weight, at most about 0.8% by weight, at most about 0.6% by weight, at most about 0.5% by weight, at most about 0.4% by weight, or at most about 0.2% by weight) the at least one diazole. Without wishing to be bound by theory, it is believed that the diazole can serve as a corrosion inhibitor and can significantly inhibit or reduce the removal of certain metal containing materials (e.g., Co) on a semiconductor substrate that are exposed to the cleaning composition during a cleaning process.

In some embodiments, the cleaning compositions described herein can optionally include aromatic anhydrides. As used herein, "aromatic anhydride" refers to a molecule containing at least one 5- or 6-membered aromatic ring and at least one anhydride moiety in the same molecule. Examples of suitable aromatic anhydrides include benzoic anhydrides (e.g., 2-sulfobenzoic anhydride) and phthalic anhydrides. In some embodiments, the cleaning compositions described herein can include at least two (e.g., three, four, or five) aromatic anhydrides. In some embodiments, the cleaning compositions described herein do not include aromatic anhydride (e.g., a sulfobenzoic anhydride). Without wishing to be bound by theory, it is believed that the aromatic anhydride can serve as a corrosion inhibitor and can significantly inhibit or reduce the removal of certain materials (e.g., SiN) on a semiconductor substrate that are exposed to the cleaning composition during a cleaning process.

In some embodiments, the cleaning compositions described herein can include at least about 0.05% by weight (e.g., at least about 0.1% by weight, at least about 0.2% by weight, or at least about 0.3% by weight) and/or at most about 1% by weight (e.g., at most about 0.7% by weight, at most about 0.6% by weight, or at most about 0.5% by weight) the aromatic anhydride.

In some embodiments, the cleaning compositions described herein can optionally include at least one acid (e.g., an organic or inorganic acid). Examples of suitable acids include polyaminocarboxylic acid, polyaminophosphoric acid, p-toluenesulfonic acid, benzoic acid, ethanesulfonic acid, phosphoric acid, 1-hydroxyethyl-1,1-diphosphoric acid, sulfuric acid, and sulfonic acid. In some embodiments, the cleaning compositions described herein can include at least two (e.g., three, four, or five) acids.

In some embodiments, the at least one acid is in an amount of from about 0.01 wt % to about 3 wt % of the cleaning compositions described herein. For example, the cleaning compositions can include at least about 0.01% by weight (e.g., at least about 0.02% by weight, at least about 0.05% by weight, at least about 0.5% by weight, at least about 0.5% by weight, at least about 1% by weight, or at least about 1.5% by weight) and/or at most about 3% by weight (e.g., at most about 2.5% by weight, at most about 2% by weight, at most about 1.5% by weight, at most about 1% by weight, at most about 0.8% by weight, at most about 0.6% by weight, at most about 0.5% by weight, at most about 0.4% by weight, or at most about 0.2% by weight) the at least one acid. In general, the acid can adjust the pH of the cleaning compositions described herein to the desired level (e.g., from about 0.5 to about 5).

In some embodiments, the cleaning compositions described herein can include (e.g., consisting of or consisting essentially of): a) at least one fluoride containing compound; b) at least one first azole compound, in which the first azole compound is a diazole; c) at least one second azole compound, in which the second azole compound is different from the first azole compound and is selected from the group consisting of diazoles, triazoles, and tetrazoles; d) at least one organic solvent; and e) water. In such embodiments, the fluoride containing compound, diazole, triazole, tetrazole, and organic solvent can be the same as those described above and can be in the same amounts as those described above.

In some embodiments, the at least first azole compound and/or the at least second azole compound can be in an amount of from about 0.1 wt % to about 2 wt % (e.g., from about 0.5 wt % to about 1 wt %) of the cleaning compositions described herein. For example, the cleaning compositions can include at least about 0.1% by weight (e.g., at least about 0.2% by weight, at least about 0.3% by weight, or at least about 0.5% by weight) and/or at most about 2% by weight (e.g., at most about 1.8% by weight, at most about 1.5% by weight, at most about 1.3% by weight, at most about 1 by weight, at most about 0.8% by weight, at most about 0.6% by weight, at most about 0.5% by weight, at most about 0.4% by weight, or at most about 0.2% by weight) the at least first azole compound and/or the at least second azole compound.

In some embodiments, the cleaning compositions described herein can have a pH of at least about 0.5 (e.g., at least about 1, at least about 1.5, at least about 2, or at least about 2.5) to at most about 5 (e.g., at most about 4.5, at most about 4, at most about 3.5, at most about 3, or at most about 2.5).

In some embodiments, the cleaning compositions described herein can contain additives such as, additional corrosion inhibitors, surfactants, additional organic solvents, biocides, and defoaming agents as optional components. Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Optional surfactants may be cationic, anionic, nonionic or amphoteric.

In some embodiments, the cleaning compositions of the present disclosure may specifically exclude one or more of the additive components, in any combination, if more than one. Such components are selected from the group consisting of polymers, oxygen scavengers, quaternary ammonium salts including quaternary ammonium hydroxides, amines, alkaline bases (such as NaOH, KOH, LiOH, $Mg(OH)_2$, and $Ca(OH)_2$), surfactants other than a defoamer, a defoamer, fluoride-containing compounds other than those described above (i.e., HF, $H_2SiF_6$, $H_2PF_6$, $HBF_4$, $NH_4F$, and tetraalkylammonium fluoride), oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, hydroxycarboxylic acids, carboxylic and polycarboxylic acids lacking amino groups, silanes (e.g., alkoxysilanes), cyclic compounds (e.g., cyclic compounds containing at least two rings, such as substituted or unsubstituted naphthalenes, or substituted or unsubstituted biphenylethers) other than the azoles (e.g., diazoles, triazoles, or tetrazoles) and triazines described herein, chelating agents other than the azoles (e.g., diazoles, triazoles, or tetrazoles) and triazines described herein, non-azole corrosion inhibitors, buffering agents, guanidine, guanidine salts, acids such as organic acids and inorganic acids (e.g., sulfonic acids, sulfuric acid, sulfurous acid, nitrous acid, nitric acid, phosphorous acid, and phosphoric acid) other than a fluoride-containing acids, pyrrolidone, polyvinyl pyrrolidone, metal halides, metal halides of the formula $W_zMX_y$, wherein W is selected from H, an alkali or alkaline earth metal, and a metal-ion-free hydroxide base moiety; M is a metal selected from the group consisting of Si, Ge, Sn, Pt, P, B, Au, Ir, Os, Cr, Ti, Zr, Rh, Ru and Sb; y is from 4 to 6; and z is 1, 2, or 3, and corrosion inhibitors other than those described in this disclosure.

The cleaning compositions described herein can be prepared by simply mixing the components together, or can be prepared by blending two compositions in a kit.

In some embodiments, this disclosure features manufacturing methods that includes a step of cleaning a semiconductor substrate containing residues (e.g., post etch residues or post ash residues). Such a cleaning step can be performed, for example, by contacting the semiconductor substrate containing post etch residues and/or post ash residues with a cleaning composition described herein. In some embodiments, the method includes rinsing the substrate after the contacting step.

In some embodiments, the method does not substantially remove Co, aluminum oxides ($Al_2O_3$), silicon oxides (SiOx), zirconium oxide (ZrOx), TiN, SiN, poly-Si, or Cu in the semiconductor substrate. For example, the method removes no more than about 5% by weight (e.g., no more than about 3% by weight, no more than about 1% by weight, no more than about 0.5% by weight, or no more than about 0.1% by weight) of any of the above materials in the semiconductor substrate.

In some embodiments, the manufacturing method further includes forming a semiconductor device (e.g., an integrated circuit device such as a semiconductor chip) from the semiconductor substrate obtained by the method described above.

Semiconductor substrates typically are constructed of silicon, silicon germanium, Group III-V compounds like GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, silicon nitride, titanium nitride, tantalum nitride, and tungsten. The semiconductor substrate may also contain layers of interlayer dielectrics, silicon oxide, silicon nitride, silicon carbide, titanium oxide, aluminum oxide, and carbon doped silicon oxide.

The semiconductor substrate can be contacted with a cleaning composition described herein by any suitable method, such as placing the composition into a tank and immersing and/or submerging the semiconductor substrate into the composition, spraying the composition onto the semiconductor substrate, streaming the composition onto the semiconductor substrate, or any combinations thereof. In some embodiments, the semiconductor substrate is immersed into the composition.

The cleaning compositions described herein can be effectively used up to a temperature of about 85° C. (e.g., from about 20° C. to about 80° C., from about 55° C. to about 65° C., or from about 60° C. to about 65° C.).

Ranges of time in which the semiconductor substrate is in contact with a cleaning composition described herein can vary widely depending on the particular method, thickness of the substrate, and temperature employed. In an immersion batch type process, a suitable time range is, for example, up to about 10 minutes (e.g., from about 1 minute to about 7 minutes, from about 1 minute to about 5 minutes, or from about 2 minutes to about 4 minutes).

The amount of time in which a semiconductor substrate (e.g., a single wafer) is in contact with a cleaning composition described herein can range from about 30 seconds to about 5 minutes (e.g., from about 30 seconds to about 4 minutes, from about 1 minute to about 3 minutes, or 1 minute to about 2 minutes).

To further promote the cleaning ability of the compositions of the present disclosure, mechanical agitation means can be employed. Examples of suitable agitation means include circulation of the composition over the substrate, streaming or spraying the composition over the substrate, and ultrasonic or megasonic agitation during the cleaning process. The orientation of the semiconductor substrate relative to the ground can be at any angle. Horizontal or vertical orientations are preferred.

Subsequent to the cleaning, the semiconductor substrate is optionally rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate, and propylene glycol monomethyl ether acetate. Alternatively, or in addition, aqueous rinses with pH>8 (such as dilute aqueous ammonium hydroxide) can be employed. Examples of aqueous or water miscible rinse solvents include, but are not limited to, dilute aqueous ammonium hydroxide, DI water, methanol, ethanol, and isopropyl alcohol. The solvent can be applied using means similar to that used in applying a cleaning composition described herein. The cleaning composition of the disclosure can be removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, or heating the semiconductor substrate with a heating means such as a hotplate or infrared lamp, Marangoni drying, rotagoni drying, IPA drying or any combinations thereof. Drying times will be dependent on the specific method employed but are typically on the order of 30 seconds up to several minutes.

The present disclosure is illustrated in more detail with reference to the following examples, which are for illustrative purposes and should not be construed as limiting the scope of the present disclosure.

EXAMPLES

Any percentages listed are by weight (wt %) unless otherwise specified. Controlled stirring during testing was done with a 1 inch stirring bar at 300 rpm unless otherwise noted.

GENERAL PROCEDURE 1

Formulation Blending

Samples of cleaning compositions were prepared by adding, while stirring, to the calculated amount of organic solvent the remaining components of the formulation. After a uniform solution was achieved, optional additives, if used, were added.

GENERAL PROCEDURE 2

Cleaning Evaluation with Beaker Test

The cleaning of PER (Post Etch Residue) from a substrate was carried out with the described cleaning compositions using a multilayered semiconductor substrate of photoresist/TiOx/SiN/Co/ILD (ILD=Inter Layer Dielectric) or photoresist/TiOx/SiN/W/ILD that had been patterned lithographically, etched in a plasma metal etcher, and followed by oxygen plasma ashing to remove the top layer of photoresist completely.

The test coupons were held using 4" long plastic locking tweezers, whereby the coupon could then be suspended into a 500 ml volume Teflon beaker containing approximately 200 milliliters of the cleaning compositions of the present disclosure. Prior to immersion of the coupon into the cleaning composition, the composition was pre-heated to the desired test condition temperature (typically 40° C. or 60° C. as noted) with controlled stirring. The cleaning tests were then carried out by placing the coupon which was held by the plastic tweezers into the heated composition in such a way that the PER layer containing side of the coupon faced the stir bar. The coupon was left static in the cleaning composition for a time period (typically 2 to 5 minutes) while the composition was kept at the test temperature under controlled stirring. When the desired cleaning time was completed, the coupon was quickly removed from the cleaning composition and placed in a 500 ml plastic beaker filled with approximately 400 ml of DI water at ambient temperature (~17° C.) with gentle stirring. The coupon was left in the beaker of DI water for approximately 30 seconds, and then quickly removed, and rinsed under a DI water stream at ambient temperature for about 30 seconds. The coupon was immediately exposed to a nitrogen gas stream from a hand held nitrogen blowing gun, which caused any droplets on the coupon surface to be blown off the coupon, and further, to completely dry the coupon device surface. Following this final nitrogen drying step, the coupon was removed from the plastic tweezers holder and placed into a covered plastic carrier with the device side up for short term storage no greater than about 2 hours. The scanning electron microscopy (SEM) images were then collected for key features on the cleaned test coupon device surface.

GENERAL PROCEDURE 3

Materials Compatibility Evaluation with Beaker Test

The blanket Co on silicon substrate, W on silicon substrate, TiOx on $SiO_2$ on silicon substrate, SiN on silicon substrate, $Al_2O_3$ on silicon substrate, TiN on silicon substrate, ILD on silicon substrate were diced into approximately 1 inch×1 inch square test coupons for the materials compatibility tests. The test coupons were initially measured for thickness or sheet resistance by the 4-point probe, CDE Resmap 273 for metallic film (Co, W), or by Elipsometry for dielectric film (TiOx, SiN and ILD) using a Woollam M-2000X. The test coupons were then installed on the 4" long plastic locking tweezers and treated as described in the cleaning procedure in General Procedure 3 with the Co, W, TiOx, SiN, or ILD layer containing side of the coupon faced the stir bar for 10 minutes.

After the final nitrogen drying step, the coupon was removed from the plastic tweezers holder and placed into a covered plastic carrier. The post-thickness or sheet resistance was then collected on the post-processing test coupon surface by the 4-point probe, CDE Resmap 273 for metallic film (Co and W) or by Elipsometry for dielectric film (TiOx, SiN and ILD) using a Woollam M-2000X.

Example 1

Formulation Examples 1-3 (FE1-3) were prepared according to General Procedure 1, and evaluated according to General Procedures 2 and 3. The formulations are summarized in Table 1 and the test results are summarized in Table 2. The results in Table 2 were obtained at a cleaning temperature of 40° C. within a cleaning time of 10 minutes.

TABLE 1

| | Composition [wt %] | | |
|---|---|---|---|
| | FE-1 | FE-2 | FE-3 |
| HF | 0.60% | 0.60% | 0.60% |
| Diethylene glycol butyl ether | 79.33% | 79.27% | 79.25% |
| Hexylene glycol | 19.33% | 19.33% | 19.33% |
| 2-Sulfobenzoic anhydride | 0.1% | 0.1% | 0.125% |
| Benzoguanamine | 0.03% | 0.03% | 0.03% |
| 5-aminotetrazole | 0.028% | 0.05% | 0.05% |
| Water | 0.62% | 0.62% | 0.62% |
| Total | 100.00% | 100.00% | 100.00% |

TABLE 2

| Material | FE-1 Etch Rates | FE-2 Etch Rates | FE-3 Etch Rates |
|---|---|---|---|
| Co, Å/min | 1.0 | 0.2 | 0.3 |
| $Al_2O_3$, Å/min | 3.8 | 3.7 | 3.7 |
| SiN, Å/min | 0.4 | 0.6 | 0.9 |
| TiN, Å/min | 1.3 | 1.2 | 1.1 |
| $Al_2O_3$ loss at 3X cleaning time, Å/min | 16.9 | 22.3 | 27.8 |
| Solution Appearance | Clear | Clear | Clear |

Formulation Examples 1-3 all cleaned post etch residues well. As shown in Table 1, Formulation Examples 1-3 exhibited a Co etch rate and an $Al_2O_3$ etch rate significantly lower than their accepted levels (i.e., 1.5 Å/min for Co and 20 Å/min for $Al_2O_3$) during the cleaning time. In other words, these formulations could significantly inhibit the corrosion of Co and $Al_2O_3$ when used to remove residues on a semiconductor substrate.

Example 2

Comparative Formulation Examples 1-6 (CFE-1 to CFE-6) and Formulation Example 4 (FE-4) were prepared according to General Procedure 1, and evaluated according to General Procedures 2 and 3. The formulations are summarized in Table 3 and the test results are summarized in Table 4. The results in Table 4 were obtained at a cleaning temperature of 40° C. within a cleaning time of 10 minutes.

TABLE 3

| Composition [wt %] | CFE-1 | CFE-2 | CFE-3 | CFE-4 | CFE-5 | CFE-6 | FE-4 |
|---|---|---|---|---|---|---|---|
| HF | 1% | 1% | 1% | 1% | 1% | 1% | 1% |
| DEGBE | 95.36% | 93.02% | 94.47% | 94.42% | 94.45% | 94.45% | 94.24% |
| Water | 3.63% | 3.63% | 3.63% | 3.63% | 3.63% | 3.63% | 3.63% |
| imidazole | 0 | 0.9% | 0 | 0 | 0 | 0 | 0 |
| pyrazole | 0 | 0 | 0.9% | 0 | 0 | 0 | 0 |
| 1,2,4-Triazole | 0 | 0 | 0 | 0.92% | 0 | 0 | 0 |
| 1,2,3-Triazole | 0 | 0 | 0 | 0 | 0.919% | 0 | 0 |
| 1H-Tetrazole | 0 | 0 | 0 | 0 | 0 | 0.93% | 0 |
| 5-Amino-1H-tetrazole | 0 | 0 | 0 | 0 | 0 | 0 | 1.13% |
| MSA | 0.012% | 1.447% | 0.003% | 0.031% | 0.001% | 0 | 0.001% |
| Total | 100% | 100% | 100% | 100% | 100% | 100% | 100% |
| PH | 0.74 | 1.14 | 2.19 | 4.21 | 1.46 | 1.76 | 1.96 |

DEGBE = Diethylene glycol butyl ether
MSA = Methanesulfonic acid

TABLE 4

| | Etch Rate (Å/min) | | | | | | |
|---|---|---|---|---|---|---|---|
| Material | CFE-1 | CFE-2 | CFE-3 | CFE-4 | CFE-5 | CFE-6 | FE-4 |
| Co | 3.0 | 66.4 | 12.4 | −1.2 | −0.9 | −1.5 | −0.8 |
| $Al_2O_3$ | 24.0 | 30.8 | 43.3 | 15.6 | 36.6 | 15.3 | 13.6 |
| SiN | 1.1 | 1.3 | 1.5 | 1.7 | 1.4 | 1.6 | 1.7 |
| $ZrO_2$ | 0.62 | 0.48 | 0.55 | 0.55 | 0.65 | 0.67 | 0.44 |

As shown in Table 4, CFE-1 to CFE-6 (which contained one diazole or triazole) exhibited relatively high levels of Co and/or $Al_2O_3$ etch rates, while FE-4 (which contained one tetrazole) exhibited relatively low levels of Co and/or $Al_2O_3$ etch rates.

Example 3

Comparative Formulation Examples 7-13 (CFE-7 to CFE-13) and Formulation Examples 5-7 (FE-5 to FE-7) were prepared according to General Procedure 1, and evaluated according to General Procedures 2 and 3. The formulations are summarized in Table 5 and the test results are summarized in Table 6. The results in Table 6 were obtained at a cleaning temperature of 35° C. within a cleaning time of 10 minutes.

TABLE 5

| Composition [wt %] | CFE-7 | CFE-8 | CFE-9 | CFE-10 | CFE-11 | CFE-12 | CFE-13 | FE-5 | FE-6 | FE-7 |
|---|---|---|---|---|---|---|---|---|---|---|
| HF | 0.6% | 0.8% | 1% | 1.2% | 0.6% | 0.8% | 1% | 0.6% | 0.8% | 1% |
| DEGEE | 91.02% | 90.6% | 90.17% | 89.75% | 90.52% | 90.1% | 89.67% | 90.59% | 90.17% | 89.74% |
| HG | 7.5% | 7.5% | 7.5% | 7.5% | 7.5% | 7.5% | 7.5% | 7.5% | 7.5% | 7.5% |
| 2-SBA | 0.15% | 0.15% | 0.15% | 0.15% | 0.15% | 0.15% | 0.15% | 0.15% | 0.15% | 0.15% |
| Benzoguanamine | 0.05% | 0.05% | 0.05% | 0.05% | 0.05% | 0.05% | 0.05% | 0.05% | 0.05% | 0.05% |
| 5-Amino-1H-tetrazole | 0 | 0 | 0 | 0 | 0 | 0 | 0 | 0.43% | 0.43% | 0.43% |
| 3,5-diamino-1,2,4-triazole | 0 | 0 | 0 | 0 | 0.5% | 0.5% | 0.5% | 0 | 0 | 0 |
| Water | 0.7% | 0.9% | 1.1% | 1.4% | 0.7% | 0.9% | 1.1% | 0.7% | 0.9% | 1.1% |
| Total | 100% | 100% | 100% | 100% | 100% | 100% | 100% | 100% | 100% | 100% |

DEGEE = Diethylene glycol ethyl ether
HG = Hexylene glycol
2-SBA = 2-Sulfobenzoic anhydride

TABLE 6

| | Etch Rate (Å/min) | | | | | | | | | |
|---|---|---|---|---|---|---|---|---|---|---|
| Materials | CFE-7 | CFE-8 | CFE-9 | CFE-10 | CFE-11 | CFE-12 | CFE-13 | FE-5 | FE-6 | FE-7 |
| ZrOx | 0.5 | 0.4 | 0.4 | 0.4 | 0.3 | 0.3 | 0.3 | 0 | 0 | 0.4 |
| Co | 9.9 | 19.7 | 25.2 | 26.0 | 2.3 | 1.5 | 2.0 | 1.7 | 2.7 | 1.2 |
| SiN | 0.6 | 0.7 | 0.8 | 0.9 | 2.2 | 2.6 | 2.9 | 0.8 | 0.9 | 1.0 |
| $Al_2O_3$ | 5.1 | 6.3 | 9.4 | 13.3 | 1.7 | 1.8 | 1.9 | 0.3 | 17.3 | 12.1 |
| Observation | Clear | Clear | Clear | Clear | Clear | Clear | Clear | Clear | Clear | Clear |

All tested formulations cleaned post etch residues well. However, as shown in Table 6, FE-5 to FE-7 (which contained a tetrazole) exhibited relatively low etch rates for ZrOx, Co, SiN, and/or Al$_2$O$_3$. By contrast, CFE-7 to CFE-10 (which contained no azole) exhibited relatively high etch rates for Co and Al$_2$O$_3$.

Example 4

Comparative Formulation Examples 14-20 (CFE-14 to CFE-20) and Formulation Examples 8-10 (FE-8 to FE-10) were prepared according to General Procedure 1, and evaluated according to General Procedures 2 and 3. The formulations are summarized in Table 7 and the test results are summarized in Table 8. The results in Table 6 were obtained at a cleaning temperature of 35° C. within a cleaning time of 10 minutes.

TABLE 7

| Composition [wt %] | CFE-14 | CFE-15 | CFE-16 | CFE-17 | CFE-18 | CFE-19 | CFE-20 | FE-8 | FE-9 | FE-10 |
|---|---|---|---|---|---|---|---|---|---|---|
| HF | 0.71% | 0.71% | 0.71% | 0.71% | 0.71% | 0.71% | 0.71% | 0.71% | 0.71% | 0.71% |
| DEGEE | 90.80% | 0 | 0 | 0 | 0 | 0 | 0 | 0 | 0 | 0 |
| DEGBE | 0 | 90.80% | 0 | 0 | 0 | 0 | 0 | 0 | 0 | 0 |
| DEGHE | 0 | 0 | 90.80% | 90.23% | 90.31% | 90.15% | 90.30% | 90.45% | 90.15% | 90.37% |
| HG | 7.5% | 7.5% | 7.5% | 7.5% | 7.5% | 7.5% | 7.5% | 7.5% | 7.5% | 7.5% |
| 2-SBA | 0.15% | 0.15% | 0.15% | 0.15% | 0.15% | 0.15% | 0.15% | 0.15% | 0.15% | 0.15% |
| Benzoguanamine | 0.05% | 0.05% | 0.05% | 0.05% | 0.05% | 0.05% | 0.05% | 0.05% | 0.05% | 0.05% |
| 1,2,3-triazole | 0 | 0 | 0 | 0.35% | 0 | 0 | 0 | 0 | 0 | 0 |
| 1,2,4-triazole | 0 | 0 | 0 | 0 | 0.35% | 0 | 0 | 0 | 0 | 0 |
| 3-amino-1,2,4-triazole | 0 | 0 | 0 | 0 | 0 | 0.65% | 0 | 0 | 0 | 0 |
| 3,5-diamino-1,2,4-triazole | 0 | 0 | 0 | 0 | 0 | 0 | 0.5% | 0 | 0 | 0 |
| 1H-tetrazole | 0 | 0 | 0 | 0 | 0 | 0 | 0 | 0.35% | 0 | 0 |
| 1H-tetrazole-carboxylic acid | 0 | 0 | 0 | 0 | 0 | 0 | 0 | 0 | 0.65% | 0 |
| 5-amino-1H-tetrazole | 0 | 0 | 0 | 0 | 0 | 0 | 0 | 0 | 0 | 0.43% |
| Water | 0.8% | 0.8% | 1.0% | 1.0% | 0.9% | 0.8% | 0.8% | 0.8% | 0.8% | 0.8% |
| Total | 100% | 100% | 100% | 100% | 100% | 100% | 100% | 100% | 100% | 100% |

DEGHE = Diethylene glycol hexyl ether

TABLE 8

| | Etch Rate (Å/min) | | | | | | | | | |
|---|---|---|---|---|---|---|---|---|---|---|
| Materials | CFE-14 | CFE-15 | CFE-16 | CFE-17 | CFE-18 | CFE-19 | CFE-20 | FE-8 | FE-9 | FE-10 |
| ZrOx | 0.4 | 0.4 | 0.3 | 0.5 | 0.4 | 0.2 | 0.1 | 0.2 | 0.5 | 0.4 |
| Co | 11.1 | 25.5 | 25.8 | 6.3 | 3.9 | 4.4 | 0.6 | 6.8 | 10.7 | 2.6 |
| SiN | 0.6 | 0.7 | 0.8 | 0.9 | 2.2 | 2.6 | 2.9 | 0.1 | 1.3 | 1.0 |
| Al$_2$O$_3$ | 6.1 | 3.2 | 1.1 | 6.0 | 5.0 | 2.6 | 0.7 | 2.3 | 1.3 | 4.8 |
| Observation | Clear | Clear | Clear | Clear | Clear | Clear | Clear | Clear | Clear | Clear |

All tested formulations cleaned post etch residues well. However, as shown in Table 8, FE-8 to FE-10 (which contained a tetrazole) exhibited relatively low etch rates for ZrOx, Co, SiN, and/or Al$_2$O$_3$. By contrast, CFE-14 to CFE-16 (which contained no azole) exhibited relatively etch rates for Co and/or Al$_2$O$_3$.

Example 5

Formulation Examples 11-16 (FE-11 to FE-16) were prepared according to General Procedure 1, and evaluated according to General Procedures 2 and 3. The formulations are summarized in Table 9 and the test results are summarized in Table 10. The results in Table 10 were obtained at a cleaning temperature of 35° C. within a cleaning time of 10 minutes.

TABLE 9

| Composition [wt %] | FE-11 | FE-12 | FE-13 | FE-14 | FE-15 | FE-16 |
|---|---|---|---|---|---|---|
| HF | 0.5% | 0.5% | 0.5% | 0.5% | 0.5% | 0.5% |
| DEGEE | 90.81% | 90.71% | 90.48% | 90.59% | 0 | 0 |
| DEGBE | 0 | 0 | 0 | 0 | 0 | 90.81% |
| DEGHE | 0 | 0 | 0 | 0 | 90.67% | 0 |
| EG | 0 | 0 | 7.5% | 7.5% | 0 | 0 |
| HG | 7.5% | 7.5% | 0 | 0 | 7.5% | 7.5% |

TABLE 9-continued

| Composition [wt %] | FE-11 | FE-12 | FE-13 | FE-14 | FE-15 | FE-16 |
|---|---|---|---|---|---|---|
| 2-SBA | 0.15% | 0.15% | 0.15% | 0.05% | 0.15% | 0.15% |
| Benzoguanamine | 0.05% | 0.05% | 0.05% | 0.05% | 0.05% | 0.05% |
| 5-amino-1H-tetrazole | 0.43% | 0.43% | 0.43% | 0.43% | 0.43% | 0.43% |
| 3,5-diamino-1,2,4-triazole | 0 | 0.1% | 0.1% | 0.1% | 0 | 0 |
| Water | 0.6% | 0.6% | 0.8% | 0.8% | 0.7% | 0.6% |
| Total | 100% | 100% | 100% | 100% | 100% | 100% |

EG = Ethylene glycol

TABLE 10

| | Etch Rate (Å/min) | | | | | |
|---|---|---|---|---|---|---|
| Materials | FE-11 | FE-12 | FE-13 | FE-14 | FE-15 | FE-16 |
| ZrOx | 0.3 | 0.3 | 0.4 | 0.1 | 0.0 | 0.1 |
| Co | 1.8 | 1.4 | 2.1 | 0.0 | 2.0 | 0.9 |
| ILD | 0.1 | 0.1 | N/A | 0.2 | N/A | 0.1 |
| SiN | 0.8 | 0.9 | 1.0 | 1.2 | 0.3 | 0.6 |
| TiN | 0.3 | 0.4 | N/A | 0.5 | N/A | 0.6 |
| a-Si | 1.1 | 1.1 | N/A | 1.2 | N/A | 0.9 |
| SiOC | −0.1 | −0.1 | N/A | 0.3 | N/A | 0.1 |
| Al₂O₃ | 4.3 | 1.5 | 2.7 | 1.4 | 1.0 | 4.0 |
| Observation | Clear | Clear | Clear | Clear | Clear | Clear |

NA = not available
a-Si = amorphous silicon

All tested formulations cleaned post etch residues well. In addition, as shown in Table 10, FE-11 to FE-16 (which contained a tetrazole) exhibited relatively low etch rates for ZrOx, Co, ILD, SiN, TiN, amorphous silicon, SiOC, and Al₂O₃.

Example 6

Comparative Formulation Examples 21-45 (CFE-21 to CFE-45) and Formulation Examples 17-24 (FE-17 to FE-24) were prepared according to General Procedure 1, and evaluated according to General Procedures 2 and 3. The formulations are summarized in Table 11 and the test results are summarized in Table 12. The results in Table 12 were obtained at a cleaning temperature of 35° C. within a cleaning time of 10 minutes.

TABLE 11

| Composition [wt %] | HF | Solvent 1 | Solvent 2 | Azole 1 | Azole 2/3 | Acid | Other | Water |
|---|---|---|---|---|---|---|---|---|
| CFE-21 | 0.8% | DEGEE 97% | None | 2E4MI 1.0% | None | Sulfuric acid 2.0% | None | Rest |
| CFE-22 | 0.8% | DEGEE 90% | None | 2E4MI 1.0% | None | Sulfuric acid 2.0% | None | Rest |
| CFE-23 | 0.8% | DEGEE 85% | None | 2E4MI 1.0% | None | Sulfuric acid 2.0% | None | Rest |
| CFE-24 | 0.8% | DEGEE 80% | None | 2E4MI 1.0% | None | Sulfuric acid 2.0% | None | Rest |
| CFE-25 | 0.8% | DEGEE 97% | None | 2E4MI 1.0% | None | None | None | Rest |
| CFE-26 | 0.8% | DEGEE 97% | None | 3-amino-pyrazole 1.0% | None | Sulfuric acid 2.0% | None | Rest |
| CFE-27 | 0.8% | DEGEE 97% | None | 3,5-dimethyl-pyrazole 1.0% | None | Sulfuric acid 2.0% | None | Rest |
| CFE-28 | 0.8% | DEGEE 97% | None | 1-methyl-imidazole 1.0% | None | Sulfuric acid 2.0% | None | Rest |
| CFE-29 | 0.8% | DEGEE 97% | None | 2-phenyl-imidazole 1.0% | None | Sulfuric acid 2.0% | None | Rest |
| CFE-30 | 0.8% | DEGEE 97% | None | 2-methyl-benzoimidazole 1.0% | None | Sulfuric acid 2.0% | None | Rest |
| CFE-31 | 0.8% | DEGEE 97% | None | pyrazole 1.0% | None | Sulfuric acid 2.0% | None | Rest |
| CFE-32 | 0.8% | DEGEE 97% | None | 2E4MI 1.0% | None | p-TSA 2.0% | None | Rest |
| CFE-33 | 0.8% | DEGEE 97% | None | 2E4MI 1.0% | None | Benzoic acid 2.0% | None | Rest |
| CFE-34 | 0.8% | DEGEE 97% | None | 2E4MI 1.0% | None | Ethane-sulfonic acid 2.0% | None | Rest |
| CFE-35 | 0.8% | DEGEE 97% | None | 2E4MI 1.0% | None | Phosphoric acid 2.0% | None | Rest |
| CFE-36 | 0.8% | DEGEE 95% | None | 2E4MI 1.0% | None | 1-Hydroxyethyl-1,1-diphosphoric acid 2.0% | None | Rest |
| CFE-37 | 0.8% | PG 97% | None | 2E4MI 1.0% | None | Sulfuric acid 2.0% | None | Rest |

TABLE 11-continued

| Composition [wt %] | HF | Solvent 1 | Solvent 2 | Azole 1 | Azole 2/3 | Acid | Other | Water |
|---|---|---|---|---|---|---|---|---|
| CFE-38 | 0.8% | DEG 97% | None | 2E4MI 1.0% | None | Sulfuric acid 2.0% | None | Rest |
| CFE-39 | 0.8% | DEGME 97% | None | 2E4MI 1.0% | None | Sulfuric acid 2.0% | None | Rest |
| CFE-40 | 0.8% | DEGBE 97% | None | 2E4MI 1.0% | None | Sulfuric acid 2.0% | None | Rest |
| CFE-41 | 0.8% | DEGEE 52% | DEGME 45% | 2E4MI 1.0% | None | Sulfuric acid 2.0% | None | Rest |
| CFE-42 | 0.8% | DEGBE 52% | DEGME 45% | 2E4MI 1.0% | None | Sulfuric acid 2.0% | None | Rest |
| CFE-43 | 0.8% | DEGEE 52% | PG 45% | 2E4MI 1.0% | None | Sulfuric acid 2.0% | None | Rest |
| CFE-44 | 0.8% | DEGEE 52% | EG 45% | 2E4MI 1.0% | None | Sulfuric acid 2.0% | None | Rest |
| CFE-45 | 0.8% | DEGEE 52% | DEGME 45% | 2E4MI 1.0% | None | Sulfuric acid 2.0% | AlCl₃ 1.0% | Rest |
| FE-17 | 0.8% | DEGEE 52% | DEGME 45% | 2E4MI 1.0% | 3-amino-pyrazole 1.0% | Sulfuric acid 2.0% | None | Rest |
| FE-18 | 0.8% | DEGEE 52% | DEGME 45% | 2E4MI 1.0% | 3-amino-1,2,4-triazole 1.0% | Sulfuric acid 2.0% | None | Rest |
| FE-19 | 0.8% | DEGEE 52% | DEGME 45% | 2E4MI 1.0% | 5-methyl-BTA 1.0% | Sulfuric acid 2.0% | None | Rest |
| FE-20 | 0.8% | DEGEE 52% | DEGME 45% | 2E4MI 1.0% | 5-amino-tetrazole 1.0% 3-amino-1,2,4-triazole 1.0% | Sulfuric acid 2.0% | None | Rest |
| FE-21 | 0.8% | DEGEE 52% | DEGME 45% | 2E4MI 1.0% | 5-phenyl-tetrazole 1.0% | Sulfuric acid 2.0% | None | Rest |
| FE-22 | 0.8% | DEGEE 52% | DEGME 45% | 3,5-dimethyl-pyrazole 1.0% | 5-amino-tetrazole 1.0% | Sulfuric acid 2.0% | None | Rest |
| FE-23 | 0.8% | DEGEE 52% | DEGME 45% | 2E4MI 1.0% | 5-amino-tetrazole 1.0% 3-amino-1,2,4-triazole 1.0% | Sulfuric acid 2.0% | AlCl₃ 1.0% | Rest |
| FE-24 | 0.8% | DEGEE 52% | DEGME 45% | 3,5-dimethyl-pyrazole 1.0% | 5-amino-tetrazole 1.0% 3-amino-1,2,4-triazole 1.0% | Sulfuric acid 2.0% | AlCl₃ 1.0% | Rest |

PG = Propylene glycol
DEG = Diethylene glycol
DEGME = Diethylene glycol methyl ether
2E4MI = 2-Ethyl-4-methylimidazole
5-methyl-BTA = 5-Methylbenzotriazole
p-TSA = p-Toluenesulfonic acid

TABLE 12

| Composition [wt %] | $Al_2O_3$ ER (Å/min) | Co ER (Å/min) | $SiO_2$ ER (Å/min) | p-Si ER (Å/min) |
|---|---|---|---|---|
| CFE-21 | 12.1 | 8.5 | 6.5 | 3.2 |
| CFE-22 | 15.4 | 13.0 | 13.0 | 4.5 |
| CFE-23 | 20.4 | 18.5 | 16.5 | 6.8 |
| CFE-24 | 156.3 | 72.0 | 52.8 | 26.5 |
| CFE-25 | 10.1 | 7.5 | 6.5 | 2.9 |
| CFE-26 | 13.5 | 11.2 | 8.3 | 3.6 |
| CFE-27 | 14.9 | 12.3 | 9.1 | 4.0 |
| CFE-28 | 14.2 | 11.8 | 8.7 | 3.8 |
| CFE-29 | 12.8 | 10.6 | 7.9 | 3.4 |
| CFE-30 | 12.2 | 10.1 | 7.5 | 3.2 |
| CFE-31 | 16.2 | 13.4 | 10.0 | 4.3 |
| CFE-32 | 9.7 | 6.8 | 5.2 | 2.6 |
| CFE-33 | 12.3 | 10.4 | 10.4 | 3.6 |
| CFE-34 | 16.3 | 14.8 | 13.2 | 5.4 |
| CFE-35 | 9.2 | 6.5 | 4.9 | 2.4 |
| CFE-36 | 11.7 | 9.9 | 9.9 | 3.4 |
| CFE-37 | 24.5 | 22.2 | 19.8 | 8.2 |
| CFE-38 | 18.6 | 16.7 | 12.5 | 6.8 |
| CFE-39 | 14.1 | 10.7 | 8.1 | 4.5 |
| CFE-40 | 8.9 | 5.1 | 4.3 | 2.5 |
| CFE-41 | 8.0 | 5.5 | 4.5 | 2.4 |
| CFE-42 | 7.2 | 5.0 | 4.1 | 2.2 |
| CFE-43 | 10.4 | 7.2 | 5.9 | 3.1 |
| CFE-44 | 9.6 | 6.6 | 5.4 | 2.9 |
| CFE-45 | 6.0 | 4.1 | 1.1 | 1.8 |
| FE-17 | 2.8 | 1.9 | 1.6 | 0.8 |
| FE-18 | 2.5 | 1.7 | 1.4 | 0.8 |
| FE-19 | 3.6 | 2.5 | 2.0 | 1.1 |

TABLE 12-continued

| Composition [wt %] | Al$_2$O$_3$ ER (Å/min) | Co ER (Å/min) | SiO$_2$ ER (Å/min) | p-Si ER (Å/min) |
|---|---|---|---|---|
| FE-20 | 1.9 | 1.3 | 1.1 | 0.6 |
| FE-21 | 3.1 | 2.1 | 1.7 | 0.9 |
| FE-22 | 2.9 | 2.0 | 1.7 | 0.9 |
| FE-23 | 0.8 | 0.5 | 0.4 | 0.2 |
| FE-24 | 0.8 | 0.6 | 0.5 | 0.3 |

ER = Etch rate
p-Si = polysilicon

As shown in Table 12, FE-17 to FE-24 (which contained a diazole and one or two additional azoles (e.g., a diazole, triazole, or tetrazole)) exhibited relatively low etch rates for Al$_2$O$_3$, Co, SiO$_2$, and p-Si, and excellent cleaning capability in all tested wafers. By contrast, CFE-21 to CFE-45 (which contained a single diazole) exhibited relatively high etch rates for Al$_2$O$_3$, Co, SiO$_2$, and p-Si.

While the invention has been described in detail with reference to certain embodiments thereof, it will be understood that modifications and variations are within the spirit and scope of that which is described and claimed.

What is claimed is:

1. A cleaning composition, comprising:
   a) at least one fluoride containing compound;
   b) at least one tetrazole;
   c) at least one triazine in an amount of from about 0.02 wt % to about 0.1 wt % of the composition;
   d) at least one organic solvent; and
   e) water.

2. The composition of claim 1, wherein the at least one tetrazole comprises a substituted or unsubstituted tetrazole.

3. The composition of claim 1, wherein the at least one tetrazole comprises a tetrazole optionally substituted by at least one substituent selected from the group consisting of COOR$_1$ and N(R$_1$R$_2$), in which each of R$_1$ and R$_2$, independently, is H or C$_1$-C$_6$ alkyl.

4. The composition of claim 1, wherein the at least one tetrazole comprises 1H-tetrazole, 1H-tetrazole-5-carboxylic acid, 5-phenyltetrazole, or 5-amino-1H-tetrazole.

5. The composition of claim 1, wherein the at least one tetrazole is in an amount of from about 0.01 wt % to about 1.5 wt % of the composition.

6. The composition of claim 1, wherein the at least one triazine comprises a substituted or unsubstituted triazine.

7. The composition of claim 1, wherein the at least one triazine comprises a triazine optionally substituted by at least one substituent selected from the group consisting of aryl and N(R$_3$R$_4$), in which each of R$_3$ and R$_4$, independently, is H or C$_1$-C$_6$ alkyl.

8. The composition of claim 1, wherein the at least one triazine comprises benzoguanamine.

9. The composition of claim 1, wherein the at least one triazine is in an amount of from about 0.02 wt % to about 0.09 wt % of the composition.

10. The composition of claim 1, wherein the at least one fluoride containing compound selected from the group consisting of HF, H$_2$SiF$_6$, H$_2$PF$_6$, HBF$_4$, NH$_4$F, and tetraalkylammonium fluoride.

11. The composition of claim 1, wherein the at least one fluoride containing compound is in an amount of from about 0.05 wt % to about 1.5 wt % of the composition.

12. The composition of claim 1, wherein the at least one organic solvent comprises a solvent selected from the group consisting of alcohols, ketones, ethers, and esters.

13. The composition of claim 1, wherein the at least one organic solvent comprises a solvent selected form the group consisting of alcohols.

14. The composition of claim 13, wherein the alcohols are alkane diols.

15. The composition of claim 14, wherein the alkane diols are glycols.

16. The composition of claim 15, wherein the glycols are selected from the group consisting of ethylene glycol, propylene glycol, butylene glycol, hexylene glycol, diethylene glycol, dipropylene glycol, triethylene glycol, and tetraethylene glycol.

17. The composition of claim 1, wherein the at least one organic solvent comprises a solvent selected from the group consisting of ethers.

18. The composition of claim 17, wherein the at least one organic solvent comprises a solvent selected from the group consisting of glycol ethers.

19. The composition of claim 18, wherein the glycol ethers are selected from the group consisting of ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutyl ether, diethylene glycol monohexyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

20. The composition of claim 1, comprising at least two organic solvents.

21. The composition of claim 1, wherein the at least one organic solvent is in an amount of at least about 90 wt % of the composition.

22. The composition of claim 1, wherein the water is in an amount of from about 0.1 wt % to about 2 wt % of the composition.

23. A cleaning composition, comprising:
   a) at least one fluoride containing compound;
   b) at least one tetrazole;
   c) at least one triazine;
   d) at least one organic solvent;
   e) water; and
   f) at least one aromatic anhydride.

24. The composition of claim 23, wherein the aromatic anhydride comprises a benzoic anhydride, a phthalic anhydride, or 2-sulfobenzoic anhydride.

25. The composition of claim 23, wherein the at least one aromatic anhydride is in an amount of from about 0.01% to about 0.5% by weight of the composition.

26. The composition of claim 1, further comprising at least one triazole.

27. The composition of claim 26, wherein the at least one triazole comprises a substituted or unsubstituted triazole.

28. The composition of claim 27, wherein the at least one triazole comprises a triazole optionally substituted by at least one substituent selected from the group consisting of alkyl groups, aryl groups, halogen groups, amino groups, nitro groups, alkoxy groups, and hydroxyl groups.

29. The composition of claim 28, wherein the at least one triazole comprises 1,2,3-triazole, 1,2,4-triazole, 3-amino-1,2,4-triazole, 3-amino-5-mercapto-1,2,4-triazole, or 3,5-diamino-1,2,4-triazole.

30. The composition of claim 26, wherein the at least one triazole comprises a substituted or unsubstituted benzotriazole.

31. The composition of claim 30, wherein the at least one triazole comprises a benzotriazole optionally substituted by at least one substituent selected from the group consisting of alkyl groups, aryl groups, halogen groups, amino groups, nitro groups, alkoxy groups, and hydroxyl groups.

32. The composition of claim 31, wherein the at least one triazole comprises benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-diimethylpropyl)-benzotriazole, 5-(1',1',3'-trimethylbutyl)benzotriazole, 5-n-octyl benzotriazole, or 5-(1',1',3',3'-tetramethylbutyl)benzotriazole.

33. The composition of claim 26, wherein the at least one triazole is in an amount of from about 0.05% to about 1% by weight of the composition.

34. The composition of claim 1, further comprising at least one acid.

35. The composition of claim 34, wherein the at least one acid comprises polyaminocarboxylic acid, polyaminophosphoric acid, p-toluenesulfonic acid, benzoic acid, ethanesulfonic acid, phosphoric acid, 1-hydroxyethyl-1,1-diphosphoric acid, sulfuric acid, or sulfonic acid.

36. The composition of claim 34, wherein the at least one acid is in an amount of from about 0.01% to about 3% by weight of the composition.

37. The composition of claim 1, further comprising at least one diazole.

38. The composition of claim 37, wherein the at least one diazole comprises a substituted or unsubstituted imidazole, or a substituted or unsubstituted pyrazole.

39. The composition of claim 37, wherein the at least one diazole comprises 1-methylimidazole, 2-phenylimidazole, 2-methylbenzoimidazole, 2-ethyl-4-methylimidazole, pyrazole, 3,5-dimethylpyrazole, or 3-aminopyrazole.

40. The composition of claim 37, wherein the at least one diazole is in an amount of from about 0.1% to about 2% by weight of the composition.

41. A cleaning composition, comprising:
a) at least one fluoride containing compound;
b) at least one tetrazole in an amount of from about 0.05 wt % to about 0.8 wt % of the composition;
c) at least one organic solvent; and
d) water;
wherein the composition does not include a sulfobenzoic anhydride.

42. A cleaning composition, comprising:
a) at least one fluoride containing compound;
b) at least one tetrazole selected from the group consisting of 1H-tetrazole and 1H-tetrazole-5-carboxylic acid;
c) at least one organic solvent;
d) at least one aromatic anhydride; and
f) water.

43. A cleaning composition, comprising:
a) at least one fluoride containing compound, provided that the at least one fluoride containing compound does not include HF;
b) at least one tetrazole;
c) at least one organic solvent;
d) at least one aromatic anhydride; and
f) water.

44. The composition of claim 43, wherein the at least one fluoride containing compound is selected from the group consisting of $H_2SiF_6$, $H_2PF_6$, $HBF_4$, $NH_4F$, and tetraalkylammonium fluoride.

45. A cleaning composition, comprising:
a) at least one fluoride containing compound;
b) at least one first azole compound, in which the first azole compound is a diazole;
c) at least one second azole compound, in which the second azole compound is different from the first azole compound and is selected from the group consisting of diazoles, triazoles, and tetrazoles;
d) at least one organic solvent; and
e) water.

46. The composition of claim 45, wherein the at least one first azole compound comprises an imidazole or a pyrazole.

47. The composition of claim 45, wherein the at least one first azole compound comprises 1-methylimidazole, 2-phenylimidazole, 2-methylbenzoimidazole, 2-ethyl-4-methylimidazole, pyrazole, 3,5-dimethylpyrazole, or 3-aminopyrazole.

48. The composition of claim 45, wherein the at least one first azole compound is in an amount of from about 0.1% to about 2% by weight of the composition.

49. The composition of claim 45, wherein the at least one second azole compound comprises a diazole.

50. The composition of claim 45, wherein the at least one second azole compound comprises a triazole.

51. The composition of claim 50, wherein the at least one second azole compound comprises a substituted or unsubstituted triazole.

52. The composition of claim 51, wherein the at least one second azole compound comprises a triazole optionally substituted by at least one substituent selected from the group consisting of alkyl groups, aryl groups, halogen groups, amino groups, nitro groups, alkoxy groups, and hydroxyl groups.

53. The composition of claim 52, wherein the at least one second azole compound comprises 1,2,3-triazole, 1,2,4-triazole, 3-amino-1,2,4-triazole, 3-amino-5-mercapto-1,2,4-triazole, or 3,5-diamino-1,2,4-triazole.

54. The composition of claim 50, wherein the at least one second azole compound comprises a substituted or unsubstituted benzotriazole.

55. The composition of claim 54, wherein the at least one second azole compound comprises a benzotriazole optionally substituted by at least one substituent selected from the group consisting of alkyl groups, aryl groups, halogen groups, amino groups, nitro groups, alkoxy groups, and hydroxyl groups.

56. The composition of claim 55, wherein the at least one second azole compound comprises benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-diimethylpropyl)-benzotriazole, 5-(1',1',3'-trimethylbutyl)benzotriazole, 5-n-octyl benzotriazole, or 5-(1',1',3',3'-tetramethylbutyl)benzotriazole.

57. The composition of claim 45, wherein the at least one second azole compound comprises a tetrazole.

58. The composition of claim 57, wherein the at least one second azole compound comprises a substituted or unsubstituted tetrazole.

59. The composition of claim 57, wherein the at least one second azole compound comprises a tetrazole optionally substituted by at least one substituent selected from the group consisting of $COOR_1$ and $N(R_1R_2)$, in which each of $R_1$ and $R_2$, independently, is H or $C_1$-$C_6$ alkyl.

60. The composition of claim 57, wherein the at least one second azole compound comprises 1H-tetrazole, 1H-tetrazole-5-carboxylic acid, 5-phenyltetrazole, or 5-amino-1H-tetrazole.

61. The composition of claim 57, wherein the at least one second azole compound is in an amount of from about 0.1 wt % to about 2 wt % of the composition.

62. The composition of claim 45, wherein the at least one fluoride containing compound selected from the group consisting of HF, $H_2SiF_6$, $H_2PF_6$, $HBF_4$, $NH_4F$, and tetraalkylammonium fluoride.

63. The composition of claim 45, wherein the at least one fluoride containing compound is in an amount of from about 0.05 wt % to about 1.5 wt % of the composition.

64. The composition of claim 45, wherein the at least one organic solvent comprises a solvent selected from the group consisting of alcohols, ketones, ethers, and esters.

65. The composition of claim 45, wherein the at least one organic solvent comprises a solvent selected form the group consisting of alcohols.

66. The composition of claim 65, wherein the alcohols are alkane diols.

67. The composition of claim 66, wherein the alkane diols are glycols.

68. The composition of claim 67, wherein the glycols are selected from the group consisting of ethylene glycol, propylene glycol, butylene glycol, hexylene glycol, diethylene glycol, dipropylene glycol, triethylene glycol, and tetraethylene glycol.

69. The composition of claim 45, wherein the at least one organic solvent comprises a solvent selected from the group consisting of ethers.

70. The composition of claim 69, wherein the at least one organic solvent comprises a solvent selected from the group consisting of glycol ethers.

71. The composition of claim 70, wherein the glycol ethers are selected from the group consisting of ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutyl ether, diethylene glycol monohexyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

72. The composition of claim 45, comprising at least two organic solvents.

73. The composition of claim 45, wherein the at least one organic solvent is in an amount of at least about 90 wt % of the composition.

74. The composition of claim 45, wherein the water is in an amount of from about 0.1 wt % to about 2 wt % of the composition.

75. The composition of claim 45, further comprising at least one triazine.

76. The composition of claim 75, wherein the at least one triazine comprises a substituted or unsubstituted triazine.

77. The composition of claim 75, wherein the at least one triazine comprises a triazine optionally substituted by at least one substituent selected from the group consisting of aryl and $N(R_3R_4)$, in which each of $R_3$ and $R_4$, independently, is H or $C_1$-$C_6$ alkyl.

78. The composition of claim 75, wherein the at least one triazine comprises benzoguanamine.

79. The composition of claim 75, wherein the at least one triazine is in an amount of from about 0.01 wt % to about 0.1 wt % of the composition.

80. The composition of claim 45, further comprising at least one aromatic anhydride.

81. The composition of claim 80, wherein the aromatic anhydride comprises a benzoic anhydride, a phthalic anhydride, or 2-sulfobenzoic anhydride.

82. The composition of claim 80, wherein the at least one aromatic anhydride is in an amount of from about 0.01% to about 0.5% by weight of the composition.

83. The composition of claim 45, further comprising at least one acid.

84. The composition of claim 83, wherein the at least one acid comprises polyaminocarboxylic acid, polyaminophosphoric acid, p-toluenesulfonic acid, benzoic acid, ethanesulfonic acid, phosphoric acid, 1-hydroxyethyl-1,1-diphosphoric acid, sulfuric acid, or sulfonic acid.

85. The composition of claim 83, wherein the at least one acid is in an amount of from about 0.01% to about 3% by weight of the composition.

86. A method for cleaning a semiconductor substrate, comprising: contacting the semiconductor substrate containing post etch residues or post ash residues with the cleaning composition of claim 1.

87. The method of claim 86, further comprising rinsing the semiconductor substrate with a rinse solvent after the contacting step.

88. An article formed by the method of claim 86, wherein the article is a semiconductor device.

89. The article of claim 88, wherein the semiconductor device is an integrated circuit.

90. A cleaning composition, comprising:
a) at least one fluoride containing compound;
b) at least one azole compound selected from the group consisting of diazoles, triazoles and tetrazoles;
c) at least one organic solvent in an amount of at least about 90 wt % of the composition;
d) at least one acid selected from the group consisting of sulfuric acid and methanesulfonic acid; and
f) water.

* * * * *

UNITED STATES PATENT AND TRADEMARK OFFICE
CERTIFICATE OF CORRECTION

PATENT NO. : 10,787,628 B2
APPLICATION NO. : 16/106331
DATED : September 29, 2020
INVENTOR(S) : Thomas Dory, Emil A. Kneer and Tetsuya Kamimura Page 1 of 1

It is certified that error appears in the above-identified patent and that said Letters Patent is hereby corrected as shown below:

In the Specification

Column 6
Line 19, delete "imethylpropyl)" and insert -- methylpropyl) --.

In the Claims

Column 23
Line 32, in Claim 32, delete "-diimethylpropyl)" and insert -- -dimethylpropyl) --.

Column 25
Line 17, in Claim 56, "-diimethylpropyl)" and insert -- -dimethylpropyl) --.

Signed and Sealed this
First Day of December, 2020

Andrei Iancu
*Director of the United States Patent and Trademark Office*